United States Patent
Yang (10) Patent No.: US 10,958,086 B2
(45) Date of Patent: Mar. 23, 2021

(54) BATTERY SYSTEM

(71) Applicant: Samsung SDI Co., Ltd., Yongin-si (KR)

(72) Inventor: Jongwoon Yang, Yongin-si (KR)

(73) Assignee: Samsung SDI Co., Ltd., Yongin-si (KR)

(*) Notice: Subject to any disclaimer, the term of this patent is extended or adjusted under 35 U.S.C. 154(b) by 143 days.

(21) Appl. No.: 16/318,301

(22) PCT Filed: Jun. 5, 2017

(86) PCT No.: PCT/KR2017/005848
§ 371 (c)(1),
(2) Date: Jan. 16, 2019

(87) PCT Pub. No.: WO2018/016735
PCT Pub. Date: Jan. 25, 2018

(65) Prior Publication Data
US 2019/0237980 A1 Aug. 1, 2019

(30) Foreign Application Priority Data
Jul. 19, 2016 (KR) .......................... 10-2016-0091438

(51) Int. Cl.
*H02J 7/00* (2006.01)
*G01R 31/36* (2020.01)
(Continued)

(52) U.S. Cl.
CPC ............ *H02J 7/0029* (2013.01); *G01R 31/36* (2013.01); *H01M 2/1077* (2013.01); *H01M 2/34* (2013.01);
(Continued)

(58) Field of Classification Search
CPC ...... H02J 7/0024; H02J 7/0029; H02J 7/0068; H01M 2/10; H01M 2/34
(Continued)

(56) References Cited

U.S. PATENT DOCUMENTS 6,396,926 B1 5/2002 Takagi et al.
9,300,016 B2 3/2016 Yun
(Continued)

FOREIGN PATENT DOCUMENTS

JP 2000-133318 A 5/2000
JP 2011-50155 A 3/2011
(Continued)

OTHER PUBLICATIONS

International Search Report for corresponding International Application No. PCT/KR2017/005848, dated Aug. 18, 2017, 5pp.
(Continued)

*Primary Examiner* — Edward Tso
*Assistant Examiner* — Aaron Piggush
(74) *Attorney, Agent, or Firm* — Lewis Roca Rothgerber Christie LLP (57) ABSTRACT

Battery systems are provided according to various embodiments. A battery system includes: a first battery rack including a first battery module having a first battery, a first rack management unit which controls charging and discharging of the first battery module, and a first rack protection circuit
(Continued)

which interrupts current of the first battery module under control of the first rack management unit; and a second battery rack including a second battery module having a second battery, a second rack management unit which controls charging and discharging of the second battery module, and a second rack protection circuit which interrupts current of the second battery module under control of the second rack management unit, wherein the first and second rack protection circuits are controlled in parallel by the first and second rack management units.

10 Claims, 6 Drawing Sheets

(51) Int. Cl.
*H01M 2/34* (2006.01)
*H01M 2/10* (2006.01)
*H01M 10/42* (2006.01)
*H01M 10/44* (2006.01)

(52) U.S. Cl.
CPC ....... *H01M 10/425* (2013.01); *H01M 10/441* (2013.01); *H02J 7/00* (2013.01); *H02J 7/0042* (2013.01); *H01M 10/42* (2013.01); *H01M 2010/4271* (2013.01); *H01M 2010/4278* (2013.01); *H01M 2200/00* (2013.01); *H02J 7/0068* (2013.01); *H02J 7/00302* (2020.01); *H02J 7/00306* (2020.01)

(58) Field of Classification Search
USPC ......... 320/119, 122, 126, 134, 140; 307/150
See application file for complete search history.

(56) References Cited

U.S. PATENT DOCUMENTS

| 2012/0319657 | A1* | 12/2012 | Ke et al. | ............... H02J 7/0024 320/134 |
|---|---|---|---|---|
| 2014/0079960 | A1* | 3/2014 | Yun | ..................... H01M 10/482 320/116 |
| 2014/0084708 | A1* | 3/2014 | Yun | .......................... H02J 4/00 307/150 |
| 2014/0175874 | A1* | 6/2014 | Stimm et al. | ......... B60L 3/0092 307/10.7 |

FOREIGN PATENT DOCUMENTS

| KR | 10-2013-0079931 A | 7/2013 |
|---|---|---|
| KR | 10-2014-0035799 A | 3/2014 |
| KR | 10-2014-0087503 A | 7/2014 |
| KR | 10-1468314 B1 | 12/2014 |
| KR | 10-2016-0052861 A | 5/2016 |

OTHER PUBLICATIONS

Written Opinion for corresponding International Application No. PCT/KR2017/005848, dated Aug. 18, 2017, 7pp.
EPO Extended Search Report dated Nov. 27, 2019, for corresponding European Patent Application No. 17831209.6 (8 pages).
EPO Office Action dated Jul. 16, 2020, issued in corresponding European Patent Application No. 17831209.6 (5 pages).
Korean Office Action dated Aug. 14, 2020, issued in corresponding Korean Patent Application No. 10-2016-0091438 (6 pages).

* cited by examiner

BATTERY SYSTEM

CROSS-REFERENCE TO RELATED APPLICATION(S)

This application is a National Phase Patent Application of International Patent Application Number PCT/KR2017/005848, filed on Jun. 5, 2017, which claims priority of Korean Patent Application No. 10-2016-0091438, filed Jul. 19, 2016. The entire contents of both of which are incorporated herein by reference.

TECHNICAL FIELD

The present disclosure relates to a battery system including a plurality of battery racks.

BACKGROUND ART

As battery systems are used in various fields, battery systems having various structures have been introduced. A battery system may include a plurality of battery racks, each of the plurality of battery racks including a rack management unit to manage charging and discharging operations of the battery rack or the like. If a rack management unit of a battery rack among a plurality of battery racks is in an abnormal state, the battery rack including the abnormal rack management unit may be overdischarged or overcharged.

DESCRIPTION OF EMBODIMENTS

Technical Problem

Accordingly, an objective of the present disclosure is to provide a battery system including battery racks configured to prevent overdischarge or overcharge even when a rack management unit of at least one of the battery racks is in an abnormal state.

Solution to Problem

According to an aspect of the present disclosure, a battery system includes: a first battery rack including a first battery module including a first battery, a first rack management unit which controls charging and discharging of the first battery module, and a first rack protection circuit which interrupts current of the first battery module under control of the first rack management unit; and a second battery rack including a second battery module including a second battery, a second rack management unit which controls charging and discharging of the second battery module, and a second rack protection circuit which interrupts current of the second battery module under control of the second rack management unit, wherein the first and second rack protection circuits are controlled in parallel by the first and second rack management units.

According to an example of the battery system, the battery system further includes a system management unit, wherein the system management unit applies a control signal to the first and second rack management units and detects, based on generation of response signals to the control signal, whether the first and second rack management units are in an abnormal state.

According to another example of the battery system, the system management unit communicates with the first and second rack management units by controller area network (CAN) communication, and the system management unit determines, based on presence of identifiers assigned to the first and second rack management units, whether the first and second rack management units are in an abnormal state.

According to another example of the battery system, the first battery module includes a first module management unit which detects a state of the first battery, and the second battery module includes a second module management unit which detects a state of the battery, wherein the first and second rack management units control at least one of the first and second battery modules.

According to another example of the battery system, when the system management unit detects that the first rack management unit is in an abnormal state, the second rack management unit receives state information about the first battery from the first module management unit and controls the first rack protection circuit based on the state information about the first battery.

According to an aspect of the present disclosure, an energy storage system includes: a battery system including a first battery rack and a second battery rack; a converter electrically connected to the battery system; a DC link electrically connected to the converter; and a power conversion device which converts electricity between the DC link and at least one of a power generation system, a grid, and a load, wherein the first battery rack includes a first rack protection circuit and a first rack management unit, and the second battery rack includes a second rack protection circuit and a second rack management unit, wherein the first and second rack protection circuits are controlled in parallel by the first and second rack management units.

According to an example of the energy storage system, the energy storage system further includes a system management unit, wherein the system management unit controls the converter and the power conversion device and applies a control signal to the first and second rack management units to detect, based on generation of response signals to the control signal, whether the first and second rack management units are in an abnormal state.

According to another example of the energy storage system, the system management unit communicates with the first and second rack management units by CAN communication, and the system management unit determines, based on presence of identifiers assigned to the first and second rack management units, whether the first and second rack management units are in an abnormal state.

According to another example of the energy storage system, the first battery rack further includes a first battery module including a first battery and a first module management unit which monitors a state of the first battery, and the second battery rack further includes a second battery module including a second battery and a second module management unit which monitors a state of the second battery, wherein the first and second rack management units control at least one of the first and second battery modules.

According to another example of the energy storage system, when the system management unit detects that the first rack management unit is in an abnormal state, the second rack management unit receives state information about the first battery from the first module management unit and controls the first rack protection circuit based on the state information about the first battery.

Advantageous Effects of Disclosure

According to various embodiments, when one of the rack management units of the battery racks of the battery system is in an abnormal state, a rack management unit of a battery rack adjacent to the abnormal rack management unit may control charging and discharging operations of the battery rack including the abnormal rack management unit.

MODE OF DISCLOSURE

Advantages and features of the present disclosure, and implementation methods thereof will be clarified through the following descriptions given with reference to the accompanying drawings. However, the following embodiments of the present disclosure are non-limiting examples and may have different forms, and it should be understood that the idea and technical scope of the present disclosure cover all the modifications, equivalents, and replacements. Rather, these embodiments are provided so that this disclosure will be thorough and complete, and will fully convey the scope of the present disclosure to those skilled in the art. Moreover, detailed descriptions related to well-known functions or configurations will be omitted in order not to unnecessarily obscure subject matters of the present disclosure.

For example, specific shapes, structures, and features described in one example embodiment may be modified in another example embodiment without departing from the scope of the present disclosure. In addition, the positions or arrangement of elements described in one example embodiment may be changed in another example embodiment within the scope of the present disclosure. That is, the following description is prevented for illustrative purposes only and is not intended to limit the scope of the present disclosure. The scope of the present disclosure is defined by the claims and equivalents thereof. In the drawings, like reference numerals denote like elements. Details described in the present disclosure are examples. That is, such details may be changed in other example embodiments within the spirit and scope of the present disclosure.

It will be understood that although the terms "first", "second", etc. may be used herein to describe various elements, these elements should not be limited by these terms. These terms are only used to distinguish one element from another.

The terminology used herein is for explaining specific embodiments only and is not intended to limit the scope of the present disclosure. The terms of a singular form may include plural forms unless otherwise mentioned. It will be understood that terms such as "comprise," "include," and "have," when used herein, specify the presence of state features, integers, steps, operations, elements, components, or combinations thereof, but do not preclude the presence or addition of one or more other features, integers, steps, operations, elements, components, or combinations thereof. It will be understood that although the terms "first" and "second" are used herein to describe various elements, these elements should not be limited by these terms. These terms are only used to distinguish one element or component from other elements or components.

Hereinafter, example embodiments will be described in detail with reference to the accompanying drawings. In the drawings, like reference numerals denote like elements, and overlapping descriptions thereof will be omitted.

Figure 1:
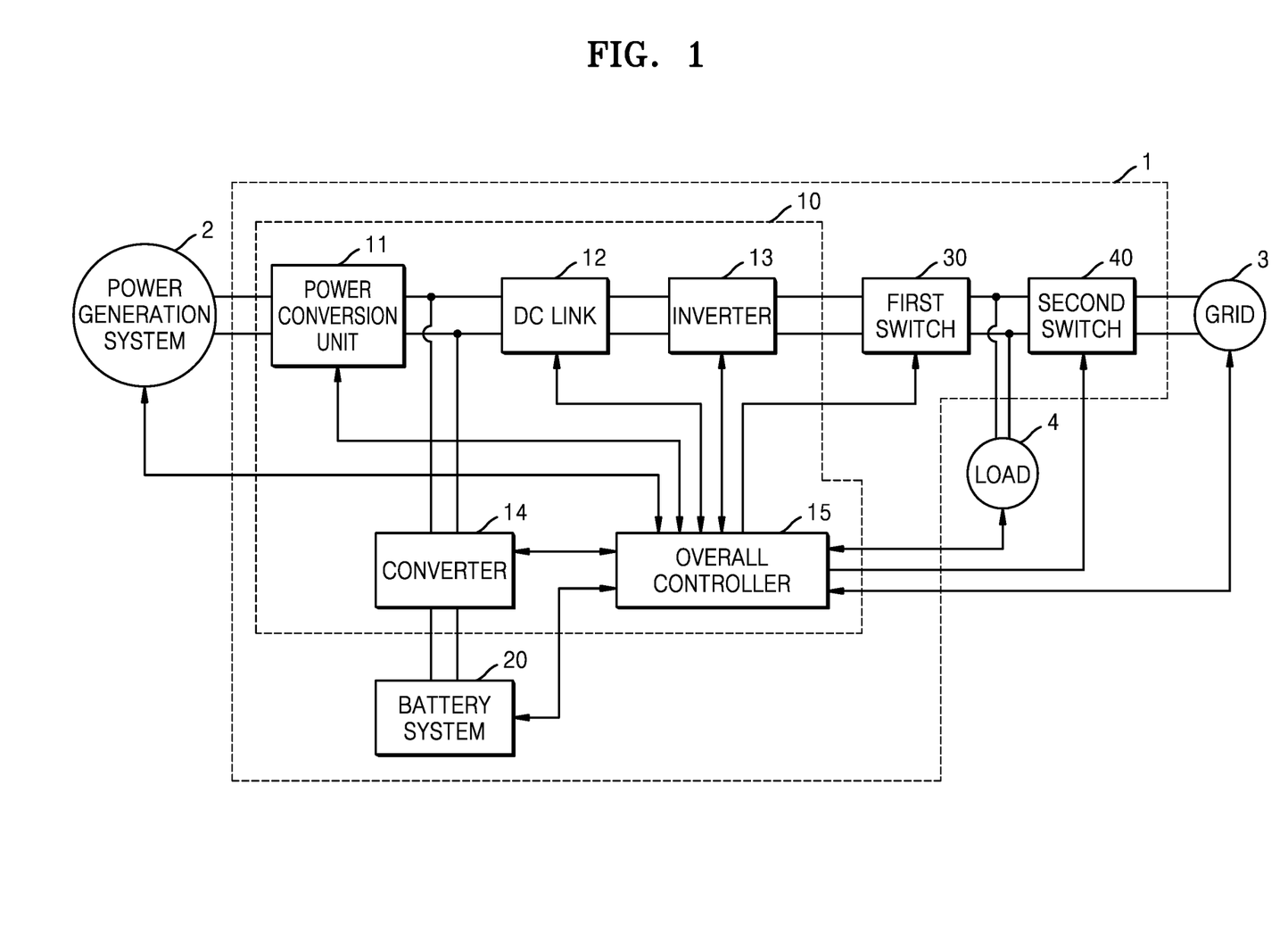
FIG. 1 is a block diagram schematically illustrating the interior of an energy storage system according to an embodiment.

FIG. 1 is a block diagram schematically illustrating the interior of an energy storage system according to an embodiment.

According to the example embodiment shown in FIG. 1, the energy storage system supplies electricity to a load in conjunction with a power generation system and a grid.

According to the present example embodiment, the power generation system 2 is a system that produces electricity from an energy source. The power generation system 2 may generate electricity and supply the electricity to the energy storage system 1. The power generation system 2 may include at least one of a solar power generation system, a wind power generation system, a tidal power generation system, etc. For example, all power generation systems that generate electricity using new renewable energy such as solar heat or geothermal heat may be included in the power generation system 2. For example, a solar cell that generates electricity using solar light may be easily installed in a home or factory, and thus may be used together with the energy storage system 1 at home or a factory. The power generation system 2 may constitute a large-capacity energy system by arranging a plurality of power generation modules capable of producing electricity in parallel.

The grid 3 may include power plants, substations, transmission lines, etc. When the grid 3 is in a normal state, the grid 3 may supply electricity to the energy storage system 1, that is, to at least one of the load 4 and a battery system 20, or may receive electricity from the energy storage system 1, that is, from the battery system 20. When the grid 3 is in an abnormal state, electricity supply between the grid 3 and the energy storage system 1 is stopped.

The load 4 may consume electricity generated by the power generation system 2, electricity stored in the battery system 20, or electricity supplied from the grid 3. Electric devices in a home or factory are examples of the load 4.

According to the present example embodiment, the energy storage system 1 may store electricity produced by the power generation system 2 in the battery system 20 or may supply the electricity to the grid 3. In addition, for example, the energy storage system 1 may supply electricity stored in the battery system 20 to the grid 3 or may store electricity supplied from the grid 3 in the battery system 20. In addition, the energy storage system 1 may supply electricity generated by the power generation system 2 or stored in the battery system 20 to the grid 3. In addition, when the grid 3 is in an abnormal state such as a power failure, the energy storage system 1 may perform an uninterruptible power supply (UPS) function to supply electricity generated by the power generation system 2 or stored in the battery system 20 to the load 4.

According to the present example embodiment, the energy storage system 1 may include a power conversion system 10 (hereinafter referred to as a PCS 10) configured to convert electricity, the battery system 20, a first switch 30, and a second switch 40.

According to the present example embodiment, the PCS 10 may convert electricity provided from the power generation system 2, the grid 3, and the battery system 20 into a suitable form of electricity and may supply the electricity to a required location. The PCS 10 may include a power conversion unit 11, a DC link 12, an inverter 13, a converter 14, and an overall controller 15.

The power conversion unit 11 may be a power conversion device connected between the power generation system 2 and the DC link 12, and may convert electricity produced by the power generation system 2 into a DC link voltage and may supply the DC link voltage to the DC link 12.

The power conversion unit 11 may include a power conversion circuit such as a converter circuit or a rectifier circuit according to the type of the power generation system 2. When the power generation system 2 produces direct current (DC) electricity, the power conversion unit 11 may include a DC-DC converter circuit configured to convert DC electricity produced by the power generation system 2 into another type of DC electricity. When the power generation system 2 generates alternating current (AC) electricity, the power conversion unit 11 may include a rectifier circuit configured to convert AC electricity into DC electricity.

For example, if the power generation system 2 is a solar power generation system, the power conversion unit 11 may include a maximum power point tracking (MPPT) converter to maximally convert electricity produced by the power generation system 2 according to factors such as the amount of solar radiation and temperature. In addition, when there is no electricity generated by the power generation system 2, the operation of the power conversion unit 11 may be stopped to minimize or reduce electricity consumed by a power conversion device such as a converter or rectifier circuit.

Although stable DC link voltage is desirable for normal operations of the converter 14 and the inverter 13, unstable DC link voltage may be generated due to problems such as an instantaneous voltage drop in the power generation system 2 or the grid 3 or generation of a peak load in the load 4. According to the present example embodiment, the DC link 12 may be connected between the power conversion unit 11 and the inverter 13 for maintaining DC link voltage at a constant level or a substantially constant level. An example of the DC link 12 may include a large-capacity capacitor.

The inverter 13 may be a power conversion device connected between the DC link 12 and the first switch 30. The inverter 13 may include an inverter configured to convert DC link voltage output from at least one of the power generation system 2 and the battery system 20 into AC voltage for the grid 3. In addition, the inverter 13 may include a rectifier circuit configured to convert AC voltage from the grid 3 into DC voltage and output the DC voltage as DC link voltage for storing electricity of the grid 3 in the battery system 20 in charge mode. The inverter 13 may be a bidirectional inverter having invertible input and output sides.

The inverter 13 may include a filter to remove harmonics from AC voltage output to the grid 3. In addition, the inverter 13 may include a phase locked loop (PLL) circuit to synchronize the phase of AC voltage output from the inverter 13 with the phase of AC voltage of the grid 3 and thus to suppress or limit the generation of reactive power. In addition, the inverter 13 may have a function such as limiting the range of voltage variation, improving a power factor, removing a DC component, or protection during transient phenomena or reducing transient phenomena.

The converter 14 may be a power conversion device connected between the DC link 12 and the battery system 20. The converter 14 may include a DC-DC converter that converts electricity stored in the battery system 20 into appropriate DC link voltage by DC-DC conversion and outputs the DC link voltage to the inverter 13 in discharge mode. In addition, the converter 14 may include a DC-DC converter that converts the voltage of electricity output from the power conversion unit 11 or the voltage of electricity output from the inverter 13 into an appropriate voltage level, that is, a charge voltage level of the battery system 20 by DC-DC conversion and outputs the charge voltage level to the battery system 20 in charge mode. The converter 14 may be a bidirectional converter having invertible input and output sides. When the battery system 20 is not being charged or discharged, the operation of the converter 14 may be stopped to minimize or reduce power consumption.

According to the present example embodiment, the overall controller 15 may monitor the states of the power generation system 2, the grid 3, the battery system 20, and the load 4. The overall controller 15 may monitor the occurrence of a power failure in the grid 3, whether the power generation system 2 generates electricity, the amount of electricity generated by the power generation system 2 when the power generation system 2 generates electricity, the state of charge of the battery system 20, the amount of power consumption of the load 4, time, etc. Although the overall controller 15 is shown as being separate from a system management unit 200 that controls input and output of the battery system 20, a single structure in which the overall controller 15 includes the system management unit 200 may be provided. However, the idea of the present disclosure is not limited thereto.

According to the present example embodiment, the overall controller 15 may control operations of the power conversion unit 11, the inverter 13, the converter 14, the battery system 20, the first switch 30, and the second switch 40 according to results of monitoring and a preset algorithm. For example, if a power failure occurs in the grid 3, electricity stored in the battery system 20 or generated by the power generation system 2 may be supplied to the load 4 under the control of the overall controller 15. In addition, when it is impossible to supply sufficient electricity to the load 4, the overall controller 15 may prioritize electrical devices of the load 4 and may control the load 4 such that electricity may be supplied to high-priority electrical devices. In addition, the overall controller 15 may control charging and discharging operations of the battery system 20.

According to the present example embodiment, the first switch 30 and the second switch 40 are connected in series between the inverter 13 and the grid 3 and are turned on/off according to the control of the overall controller 15 to control the flow of current between the power generation system 2 and the grid 3. The first switch 30 and the second switch 40 may be turned on/off depending on the states of the power generation system 2, the grid 3, and the battery system 20.

For example, the first switch 30 may be turned on to supply electricity to the load 4 from at least one of the power generation system 2 and the battery system 20, or to supply electricity from the grid 3 to the battery system 20. The second switch 40 may be turned on to supply electricity to the grid 3 from at least one of the power generation system 2 and the battery system 20, or to supply electricity from the grid 3 to at least one of the load 4 and the battery system 20.

If a power failure occurs in the grid 3, the second switch 40 may be turned off, and the first switch 30 may be turned on. Therefore, electricity may be supplied to the load 4 from at least one of the power generation system 2 and the battery system 20, and along with this, the electricity supplied to the load 4 may be prevented from flowing to the grid 3. In this manner, the energy storage system 1 may be operated as a stand alone system to prevent workers working on power lines or the like of the grid 3 from being electrically shocked by electricity from the power generation system 2 or the battery system 20.

The first and second switches 30 and 40 may include switching devices such as relays durable to high current or capable of controlling high current.

According to the present example embodiment, the battery system 20 may store electricity received from at least one of the power generation system 2 and the grid 3 and may supply the stored electricity to at least one of the load 4 and the grid 3. The battery system 20 may include a portion storing electricity and portions controlling and protecting the electricity storing portion. Charging and discharging operations of the battery system 20 may be controlled by the overall controller 15.

Hereinafter, the battery system 20 will be described in more detail with reference to FIG. 2.

Figure 2:
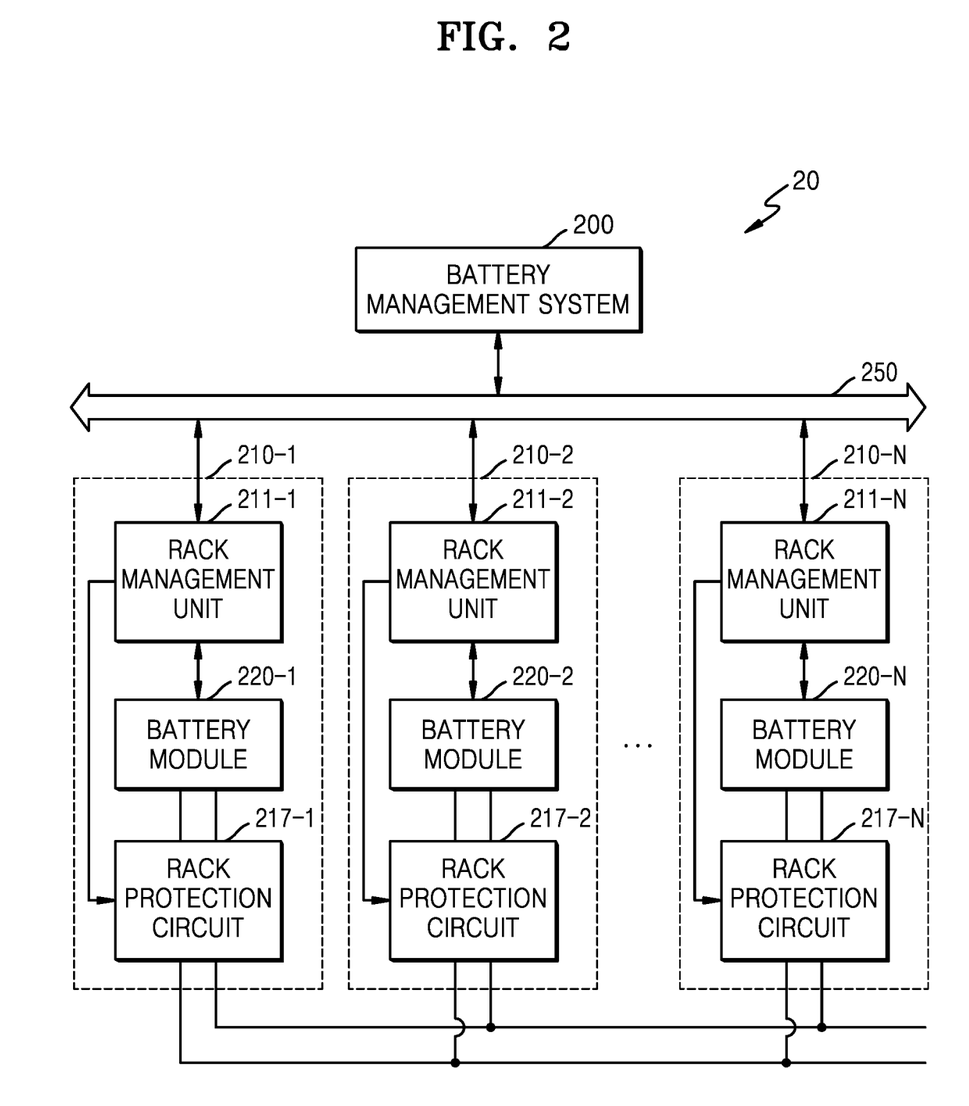
FIG. 2 is a block diagram illustrating a battery system according to an example embodiment.

FIG. 2 is a block diagram illustrating the battery system according to an example embodiment.

According to the example embodiment shown in FIG. 2, the battery system 20 includes the system management unit 200, a plurality of battery racks 210-1 to 210-N, and a bus line 250 for data communication.

The plurality of battery racks 210-1 to 210-N may store electricity supplied from the outside, that is, from the power generation system 2 and/or the grid 3, and may supply the stored electricity to the grid 3 and/or the load 4. The plurality of battery racks 210-1 to 210-N may include a plurality of battery modules 220-1 to 220-N, a plurality of rack management units 211-1 to 211-N, and a plurality of rack protection circuits 217-1 to 217-N, respectively.

The plurality of battery modules 220-1 to 220-N store electricity and include one or more battery modules connected in series, parallel, or a combination of series and parallel. Charging and discharging operations of the plurality of battery modules 220-1 to 220-N may be respectively controlled by the plurality of rack management units 211-1 to 211-N corresponding thereto. The plurality of battery modules 220-1 to 220-N may be connected in series or parallel to each other according to a required output voltage. In FIG. 2, the plurality of battery modules 220-1 to 220-N of the plurality of battery racks 210-1 to 210-N are illustrated as being connected in parallel to each other. However, the plurality of battery modules 220-1 to 220-N may be connected in series or a combination of series and parallel according to requirements on the battery system 20. Each of the plurality of battery modules 220-1 to 220-N includes a battery 219 and a module management unit 215 configured to monitor the state of the battery 219 such as voltage, current, or temperature.

The plurality of rack management units 211-1 to 211-N may respectively control overall operations of the plurality of battery racks 210-1 to 210-N corresponding thereto. Each of the plurality of rack management units 211-1 to 211-N may control charging and discharging operations of a corresponding battery module 220 of the plurality of battery modules 220-1 to 220-N by controlling a corresponding rack protection circuit 217 of the plurality of rack protection circuits 217-1 to 217-N. For example, in an overcurrent or overdischarged state, an Nth rack management unit 211-N opens a switch included in an Nth rack protection circuit 217-N to block input and output of an Nth battery rack 210-N. In addition, the Nth rack management unit 211-N may monitor the state of an Nth battery module 220-N such as temperature, voltage, or current, and may transmit measured data to the system management unit 200. In addition, the Nth rack management unit 211-N may control a cell balancing operation for battery cells included in the Nth battery module 220-N according to the measured data and a preset algorithm.

Hereinafter, for ease of illustration, one of the plurality of battery racks 210-1 to 210-N, one of the plurality of battery modules 220-1 to 220-N, one of the plurality of rack management units 211-1 to 211-N, one of the plurality of rack protection circuits 217-1 to 217-N may be referred to as an Mth battery rack 210-M, an Mth battery module 220-M, an Mth rack management unit 211-M, and an Mth rack protection circuit 217-M where M is an integer ranging from 1 to N.

The Mth rack protection circuit 217-M may control input and output of the Mth battery rack according to the control of the corresponding Mth rack management unit 211-M. In addition, the Mth rack protection circuit 217-M may provide the state of the Mth battery module 220-M such as an output voltage, an output current, a switch state, or a fuse state to the corresponding Mth rack management unit 211-M.

Electricity output from the plurality of battery modules 220-1 to 220-N may be supplied to the converter 14 (refer to FIG. 1) through the plurality of rack protection circuits 217-1 to 217-N, and electricity supplied from the converter 14 may be stored in the plurality of battery modules 220-1 to 220-N through the plurality of rack protection circuits 217-1 to 217-N. Power lines extending from the plurality of rack protection circuits 217-1 to 217-N may be connected in parallel, series, or a combination of series and parallel according to factors such as the amount of electricity or the magnitude of voltage output from the plurality of battery modules 220-1 to 220-M.

The Mth rack management unit 211-M may collect data from the Mth battery module 220-M and the Mth rack protection circuit 217-M. Data collected from the Mth rack protection circuit 217-M may include an output current value, an output voltage value, a switch state, a fuse state, etc., and data collected from the Mth battery module 220-M may include a battery cell voltage vale and a temperature value, etc.

Based on the collected data, the Mth rack management unit 211-M may calculate values such as the remaining electricity, life span, state of charge (SOC) of the Mth battery module 220-M or may determine whether the Mth battery module 220-M is in an abnormal state. For example, the Mth rack management unit 211-M may determine whether the Mth battery module 220-M is in an abnormal state such as overcharge, overdischarge, overcurrent, overvoltage, overheating, battery cell imbalance, or battery cell deterioration. If it is determined that the Mth battery module 220-M is in an abnormal state, the Mth rack management unit 211-M may take action according to an internal algorithm. For example, the Mth rack management unit 211-M may operate the Mth rack protection circuit 217-M.

The bus line 250 is a path for transmitting data or commands between the system management unit 200 and the plurality of rack management units 211-1 to 211-N. CAN protocol may be used as a protocol for communication between the system management unit 200 and the plurality of rack management units 211-1 to 211-N, or another communication protocol for transmitting data or commands using a bus line may be used.

The plurality of rack management units 211-1 to 211-N may provide data collected from the plurality of battery modules 220-1 to 220-N to the system management unit 200 through the bus line 250. The plurality of rack management units 211-1 to 211-N may also provide information about the occurrence of abnormality and the type of abnormality to the system management unit 200. In this case, the system management unit 200 may control the plurality of rack management units 211-1 to 211-N. For example, the system management unit 200 may transmit a control command for operating the plurality of rack protection circuits 217-1 to 217-N to the plurality of rack management units 211-1 to 211-N.

The system management unit 200 may transmit data collected from the plurality of rack management units 211-1 to 211-N to the overall controller 15 shown in FIG. 1. The system management unit 200 may also provide the overall controller 15 with information about whether the plurality of battery racks 210-1 to 210-N are in an abnormal state and the types of abnormality. In addition, the overall controller 15 may also provide the system management unit 200 with information about the state of the PCS 10, for example, the state of the converter 14. For example, the overall controller 15 may inform the system management unit 200 of opened states of input and output terminals of the converter 14 or information about the flow current in the converter 14. The system management unit 200 may control the operation of the battery system 20 based on the information received from the overall controller 15. For example, to turn on at least one of the plurality of battery racks 210-1 to 210-N according to the state of the PCS 10, the system management unit 200 may transmit a control command to a corresponding rack management unit 211 among the plurality of rack management units 211-1 to 211-N.

Figure 3:
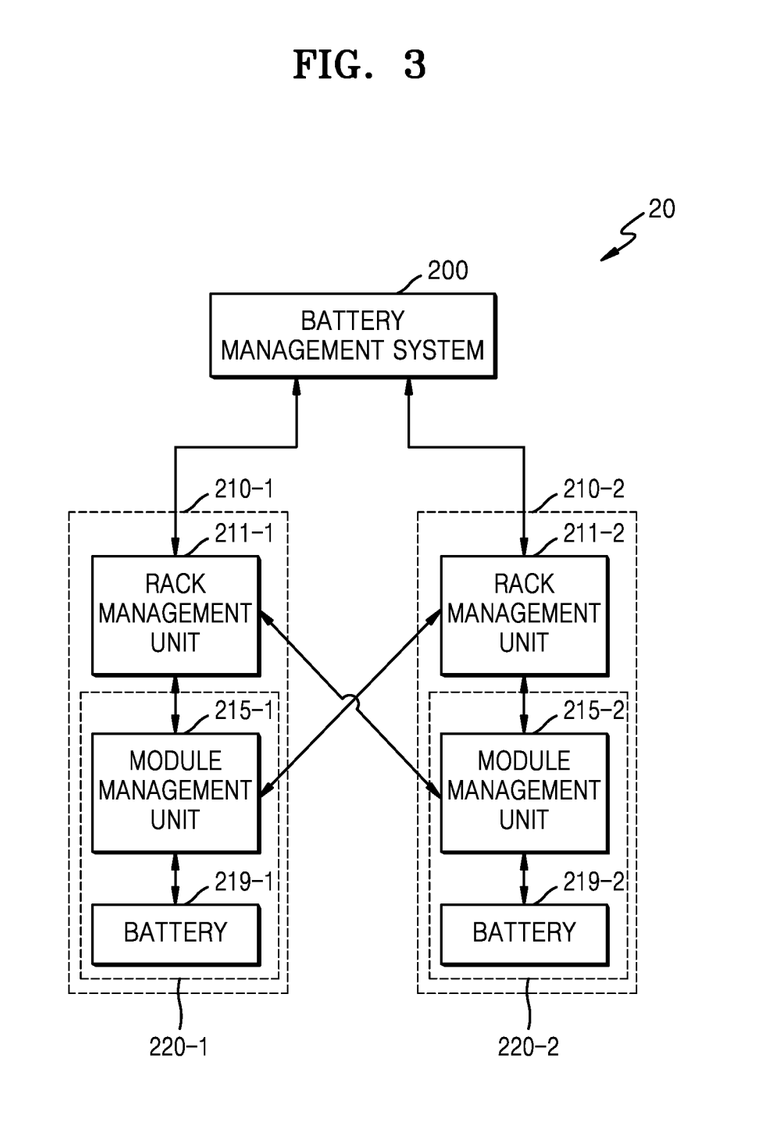
FIG. 3 is a schematic view illustrating internal structures of a first battery rack and a second battery rack, according to an embodiment of the present disclosure.

FIG. 3 is a schematic view illustrating internal structures of a first battery rack and a second battery rack according to an embodiment of the present disclosure.

According to the example embodiment shown in FIG. 3, the first and second battery racks 210-1 and 210-2 may include first and second battery modules 220-1 and 220-2 and first and second rack management units 211-1 and 211-2.

The first and second battery modules 220-1 and 220-2 store electricity supplied from the grid 3 and/or the power generation system 2 and supply the stored electricity to the grid 3 and/or the load 4. Each of the first and second battery modules 220-1 and 220-2 may include a battery 219 and a module management unit 215.

Each of first and second batteries 219-1 and 219-2 may include one or more battery cells storing electricity and connected in series, parallel, or a combination of series and parallel. The number of battery cells included in each of the first and second batteries 219-1 and 219-2 may be determined according to a required output voltage. The battery cells may include rechargeable secondary battery cells. Examples of the battery cells may include nickel-cadmium battery cells, lead battery cells, nickel metal hydride (NMH) battery cells, lithium-ion battery cells, and lithium polymer battery cells.

The charging and discharging operations of the first and second batteries 219-1 and 219-2 may be controlled by first and second module management units 215-1 and 215-2 corresponding to the first and second batteries 219-1 and 219-2. In addition, the first and second batteries 219-1 and 219-2 may be connected in series to each other to provide an output voltage required for the first and second battery racks 210-1 and 210-2. In addition, power lines may extend from both end battery cells of the first and second batteries 219-1 and 219-2 connected in series to supply electricity to the converter 14 (refer to FIG. 1) through first and second rack protection circuits 217-1 and 217-2.

The first battery rack 210-1 may receive a control signal from the outside. The first battery rack 210-1 includes a first port (not shown) capable of receiving a control signal from the outside and transmitting data to the outside and a second port (not shown) capable of applying a control signal to the outside and receiving data from the outside. The first port and the second port may be electrically connected to a bus line (not shown). The first port may provide a path through which a control signal may be applied to the first rack protection circuit 217-1 and a path through which the first module management unit 215-1 may transmit information about the first battery 219-1 to the second battery rack 210-2. The second port may provide a path through which a second control signal, that is, a control signal for controlling the second rack protection circuit 217-2 included in the second battery rack 210-2 may be applied, and a path through which information about the state of the first battery 219-1 transmitted by the first module management unit 215-1 included in the first battery rack 210-1 is transmitted. The second battery rack 210-2 includes ports corresponding to the first port and the second port.

When the first rack protection circuit 217-1 receives at least one of a first control signal transmitted from the first rack management unit 211-1 and a second control signal applied by the second rack management unit 211-2 of the second battery rack 210-2, the first rack protection circuit 217-1 blocks input and output of the first battery rack 210-1. For example, the first rack protection circuit 217-1 may include an OR gate through which a control signal for blocking is output when the first rack protection circuit 217-1 receives at least one of the first control signal and the second control signal.

Here, the first control signal refers to a control signal by which the first rack management unit 211-1 controls the first rack protection circuit 217-1 and a control signal by which the second rack management unit 211-2 operates the second rack protection circuit 217-2, and the second control signal refers to a control signal by which the first rack management unit 211-1 controls the second rack protection circuit 217-2 and a control signal by which the second rack management unit 211-2 controls the first rack protection circuit 217-1.

According to an embodiment, the first and second ports of the first and second battery racks 210-1 and 210-2 are connected to each other such that the first and second rack protection circuits 217-1 and 217-2 may be controlled by at least one of the first and second rack management units 211-1 and 211-2, and each of the first and second module management units 215-1 and 215-2 may transmit information about a corresponding battery 219 of the first and second batteries 219-1 and 219-2 to at least one of the first and second rack management unit 211-1 and 211-2.

According to an embodiment, when the first rack management unit 211-1 is in an abnormal state, the first rack management unit 211-1 may not normally judge information about the first battery 219-1 transmitted from the first module management unit 215-1. In this case, the first battery 219-1 may be damaged or exploded due to overcharge or overdischarge. As described later with reference to FIG. 5, the system management unit 200 may monitor the states of the first and second rack management units 211-1 and 211-2 to detect a abnormal rack management unit 211 among the first and second rack management units 211-1 and 211-2. If the system management unit 200 detects that the first rack management unit 211-1 is in an abnormal state, the system management unit 200 may request the second rack management unit 211-2 to control the first battery rack 210-1. In response to the request from the system management unit 200, the second rack management unit 211-2 may request the first module management unit 215-1 for information about the state of the first battery 219-1. If the second rack management unit 211-2 determines, based on the information received from the first module management unit 215-1, that there is a possibility that the first battery 219-1 is overcharged or overdischarged, the second rack management unit 211-2 may output a second control signal to turn off the first rack protection circuit 217-1.

Figure 4:
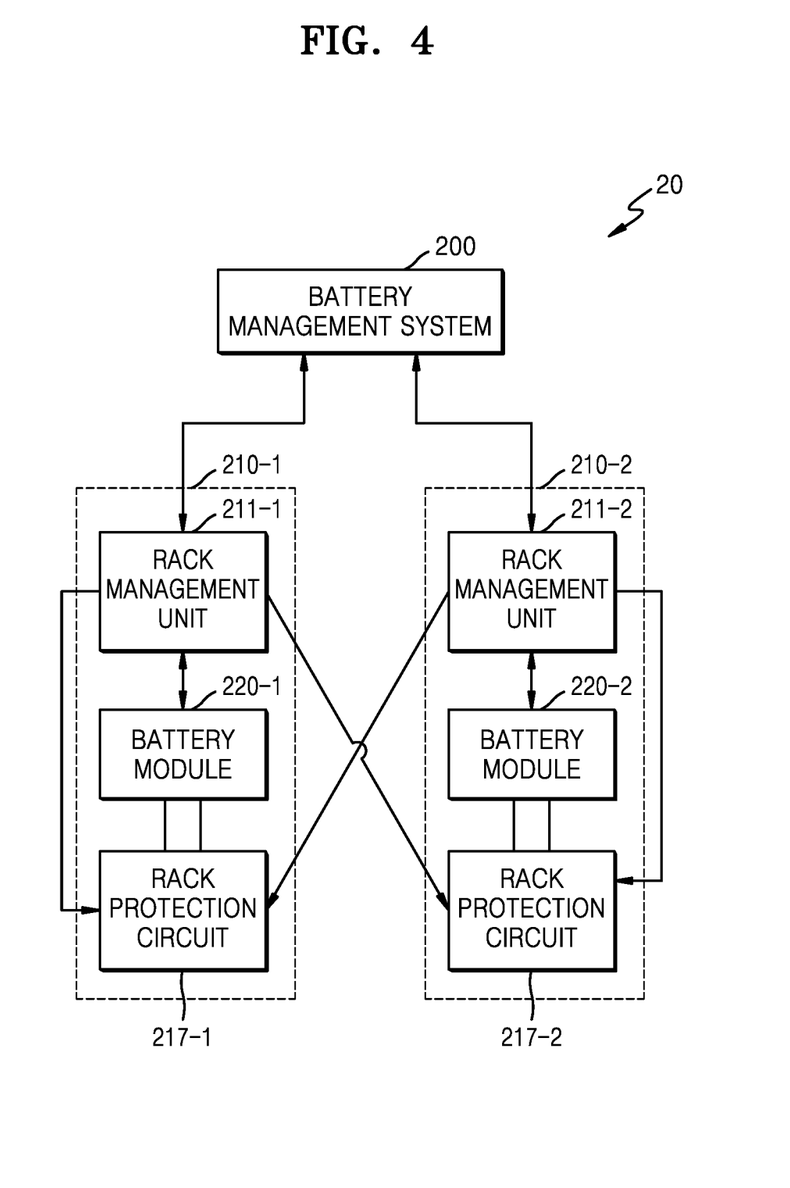
FIG. 4 is a schematic view illustrating internal structures of a first battery rack and a second battery rack, according to another embodiment.

FIG. 4 is a schematic view illustrating internal structures of a first battery rack and a second battery rack according to another embodiment.

Referring to FIG. 4, the first battery rack 210-1 includes a first battery module 220-1, a first rack protection circuit 217-1, and a first rack management unit 211-1, and the second battery rack 210-2 includes a second battery module 220-2, a second rack protection circuit 217-2, and a second rack management unit 211-2.

According to an embodiment, the first rack protection circuit 217-1 is controlled in parallel by the first and second rack management units 211-1 and 211-2. The second rack management unit 211-2 may control the first rack protection circuit 217-1 in response to a request from the system management unit 200, and if there is no request, the first rack protection circuit 217-1 is controlled by the first rack management unit 211-1. The first rack protection circuit 217-1 may include a switch unit (not shown), and when the first battery module 220-1 is overcharged or overdischarged, the first rack management unit 211-1 may turn off the switch unit to stop charging or discharging of the first battery rack 210-1. When the first rack management unit 211-1 is in an abnormal state and fails to control the first rack protection circuit 217-1, the first battery module 220-1 may not be prevented from being overdischarged or overcharged. In this case, the system management unit 200 may request the second rack management unit 211-2 to analyze the state of a first battery 219-1 and to control the first rack protection circuit 217-1. Like the first rack protection circuit 217-1, the second rack protection circuit 217-2 is also controlled in parallel by the first and second rack management units 211-1 and 211-2.

According to an embodiment, when the system management unit 200 detects that the second battery rack 210-2 is in an abnormal state, the system management unit 200 requests the first rack management unit 211-1 to control the second rack protection circuit 217-2. The first rack management unit 211-1 may request the second module management unit 215-2 for information about the state of a second battery 219-2 and may control the second rack protection circuit 217-2 on the basis of the information about the state of the second battery 219-2. For example, when there is a possibility that the second battery 219-2 is overcharged, the first rack management unit 211-1 applies a second control signal described with reference to FIG. 3 to cut electrical connection between the second battery 219-2 and a power line.

Figure 5:
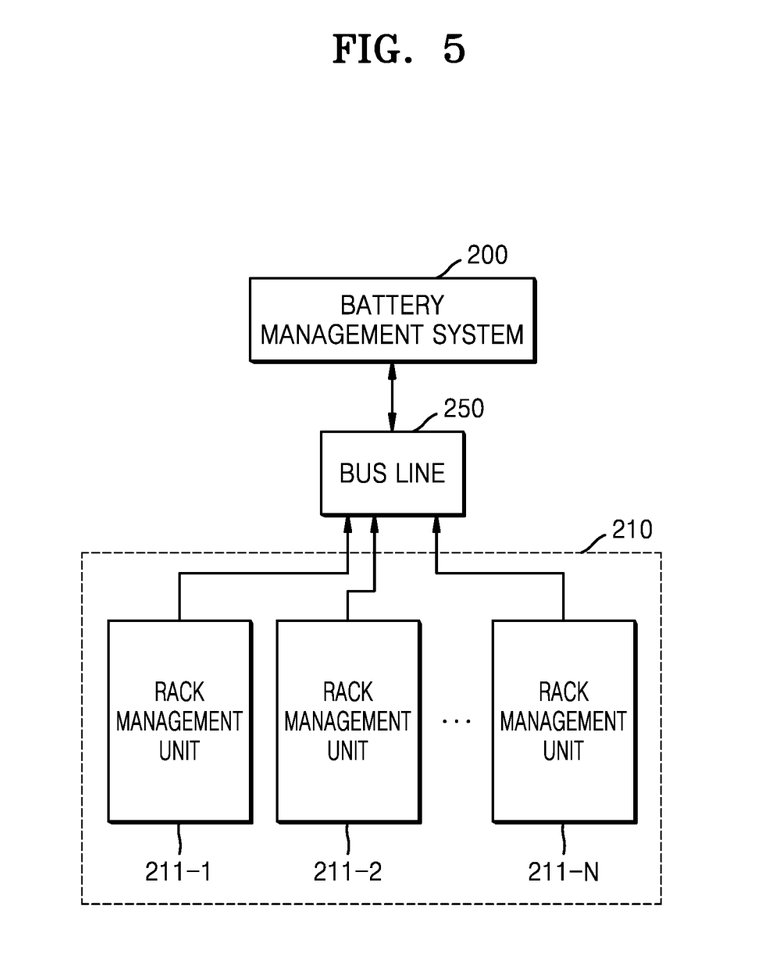
FIG. 5 is a block diagram illustrating control and communication methods for a system management unit and a plurality of rack management units of the battery system, according to an example embodiment.

FIG. 5 is a block diagram illustrating control and communication methods for the system management unit and the plurality of rack management units of the battery system according to an example embodiment.

In the example embodiment shown in FIG. 5, CAN communication is used. Accordingly, the bus line 250 may include a pair of wires (not shown) to which a control signal is transmitted or applied and another pair of wires (not shown) to which a communication signal is transmitted or applied. The control signal may be transmitted through a single line, or may be transmitted by an optical communication method or a wireless communication method. In addition, the communication signal may be transmitted by a parallel communication method using a plurality of wires, an optical communication method, or a wireless communication method in addition to a serial communication method using the other pair of wires.

In the embodiment shown in FIG. 5, for ease of understanding, the system management unit 200 and the plurality of rack management units 211-1 to 211-N are described as communicating with each other by CAN (controller area network) communication. However, other communication methods may also be used on the same principle.

According to an embodiment, the system management unit 200 may apply a control signal to the plurality of rack management units 211-1 to 211-N, and on the basis of whether the plurality of rack management units 211-1 to 211-N respond to the control signal, the system management unit 200 may monitor whether the plurality of rack management units 211-1 to 211-N operate normally.

For example, identifiers are respectively assigned to the plurality of rack management units 211-1 to 211-N, and the system management unit 200 detects response signals to the control signal and monitors whether there is a missing identifier among the identifiers. When there is a missing identifier, the system management unit 200 may determine that a rack management unit to which the missing identifier is assigned is in an abnormal state.

According to an embodiment, the system management unit 200 receives information about the states of the plurality of battery racks 210-1 to 210-N from the plurality of rack management units 211-1 to 211-N via the bus line 250. The system management unit 200 may output a control signal to the plurality of rack management units 211-1 to 211-N based on the received information. When an Lth rack management unit 211-L of an Lth battery rack 210-L is in an abnormal state, the Lth rack management unit 211-L may not report the state of the Lth battery rack 210-L to the system management unit 200 or may fail to respond to the control signal of the system management unit 200. In this case, the system management unit 200 may detect that an identifier assigned to the Lth rack management unit 211-L is missing, and the system management unit 200 may determine that the Lth rack management unit 211-L is in an abnormal state.

Figure 6:
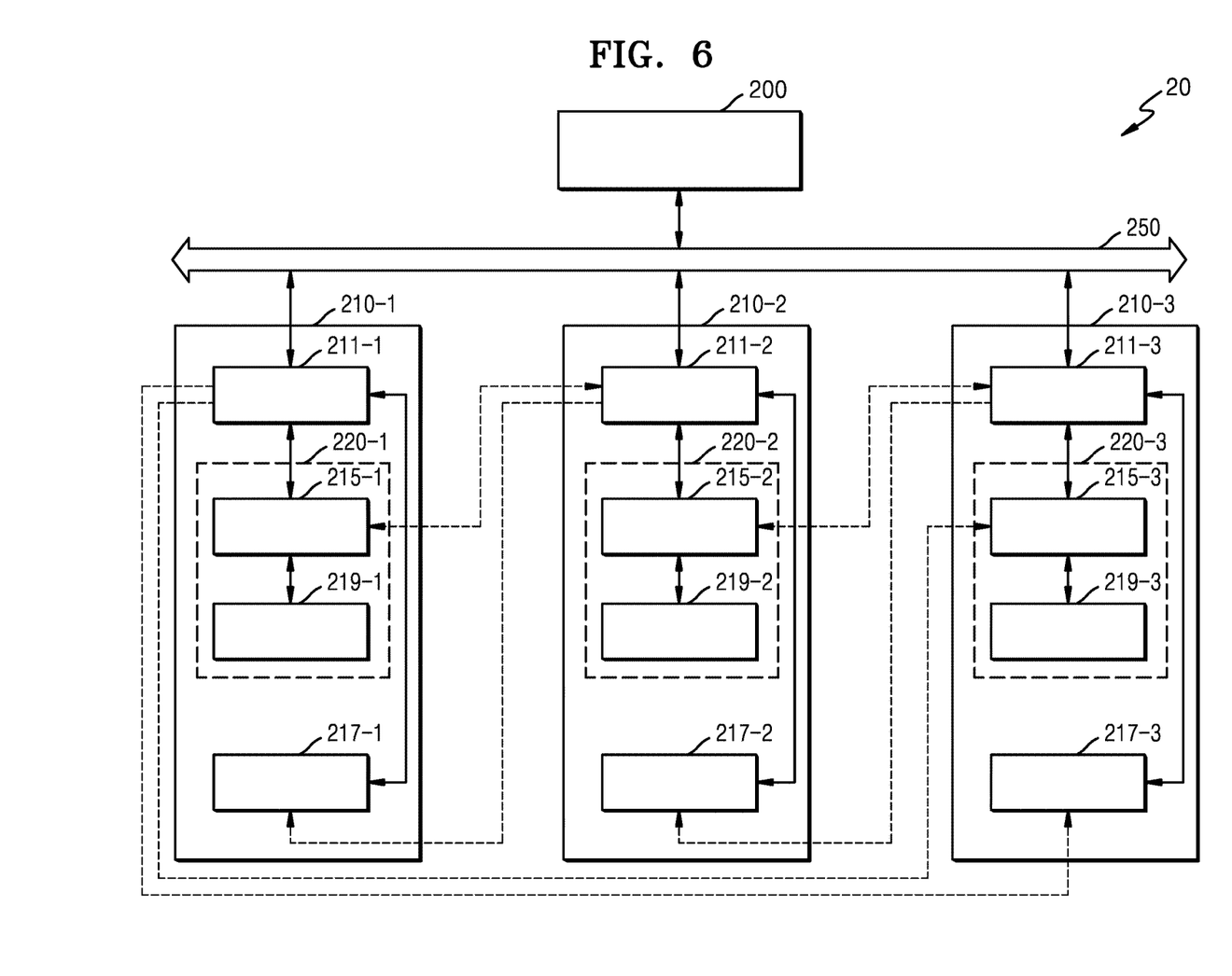
FIG. 6 is a view schematically illustrating an internal structure of the battery system according to another embodiment.

FIG. 6 is a view schematically illustrating an internal structure of the battery system according to another embodiment.

Referring to FIG. 6, the battery system 20 includes first to third battery racks 210-1 to 210-3, first to third battery modules 220-1 to 220-3, and first to third rack protection circuits 217-1 to 217-3. The first battery module 220-1 includes a first module management unit 215-1 and a first battery 219-1; the second battery module 220-2 includes a second module management unit 215-2 and a second battery 219-2; and the third battery module 220-3 includes a third module management unit 215-3 and a third battery 219-3.

According to an embodiment, the system management unit 200 applies a control signal to the first to third battery racks 210-1 to 210-3, and receives signals in response to the control signal. The first to third battery racks 210-1 to 210-3 are respectively assigned unique identifiers. If a specific identifier is missing in the response signals, the system management unit 200 determines that a rack management unit 211 of a battery rack 210 corresponding to the missing identifier is in an abnormal state. The system management unit 200 may apply a third control signal to a battery rack 210 capable of secondarily managing the abnormal battery rack 210 such that the battery rack 210 may manage a battery 219 and a rack protection circuit 217 of the abnormal battery rack 210.

According to an embodiment, a second port of the first battery rack 210-1 is connected to a first port of the third battery rack 210-3, a first port of the first battery rack 210-1 is connected to a second port of the second battery rack 210-2, and a first port of the second battery rack 210-2 is connected to a second port of the third battery rack 210-3.

If the system management unit 200 applies a third control signal to a second rack management unit 211-2 because a first rack management unit 211-1 is in an abnormal state, the second rack management unit 211-2 may receive information about the state of the first battery 219-1 through the second port of the second battery rack 210-2 and may output a second control signal described with reference to FIG. 3 to the second port of the second battery rack 210-2. In this case, the first module management unit 215-1 outputs information about the state of the first battery 219-1 to the first port of the first battery rack 210-1, and the first rack protection circuit 217-1 is operated by the second control signal applied to the first port of the first battery rack 210-1.

Likewise, if the system management unit 200 applies a third control signal to a third rack management unit 211-3, the third rack management unit 211-3 may receive information about the state of the second battery 219-2 through the second port of the third battery rack 210-3 and may output a second control signal to the second port of the third battery rack 210-3. In this case, the second module management unit 215-2 outputs information about the state of the second battery 219-2 to the first port of the second battery rack 210-2, and the second rack protection circuit 217-2 is operated by the second control signal applied to the first port of the second battery rack 210-2.

In addition, if the system management unit 200 applies a third control signal to the first rack management unit 211-1 because the third rack management unit 211-3 is in an abnormal state, the first rack management unit 211-1 may receive information about the state of the third battery 219-3 through the second port of the first battery rack 210-1 and may output a second control signal to the second port of the first battery rack 210-1. In this case, the third module management unit 215-3 outputs information about the state of the third battery 219-3 to the first port of the third battery rack 210-3, and the third rack protection circuit 217-3 is operated by the second control signal applied to the first port of the third battery rack 210-3.

While preferable embodiments of the present disclosure have been described, it will be apparent to those skilled in the art that various changes and modifications may be made without departing from the spirit and scope of the present disclosure. Therefore, the embodiments described herein should be considered in a descriptive sense only and not for purposes of limitation. The scope of the present disclosure is defined not by the above description but by the following claims, and all differences within equivalent ranges of the scope of the present disclosure should be considered as being included in the scope of the present disclosure.

The invention claimed is:

1. A battery system comprising:
a first battery rack comprising a first battery module including a first battery, a first rack management unit which controls charging and discharging of the first battery module, and a first rack protection circuit which interrupts current of the first battery module under control of the first rack management unit; and
a second battery rack comprising a second battery module including a second battery, a second rack management unit which controls charging and discharging of the second battery module, and a second rack protection circuit which interrupts current of the second battery module under control of the second rack management unit,
wherein the first rack management unit is configured to control both the first and second rack protection circuits, and
wherein the second rack management unit is configured to control both the first and second rack protection circuits.

2. The battery system of claim 1, further comprising a system management unit, wherein the system management unit applies a control signal to the first and second rack management units and detects, based on generation of response signals to the control signal, whether the first and second rack management units are in an abnormal state.

3. The battery system of claim 2, wherein the system management unit communicates with the first and second rack management units by controller area network (CAN) communication, and
the system management unit determines, based on presence of identifiers assigned to the first and second rack management units, whether the first and second rack management units are in an abnormal state.

4. The battery system of claim 2, wherein the first battery module comprises a first module management unit which detects a state of the first battery, and the second battery module comprises a second module management unit which detects a state of the second battery,
wherein the first and second rack management units control at least one of the first and second battery modules.

5. The battery system of claim 4, wherein, when the system management unit detects that the first rack management unit is in an abnormal state, the second rack management unit receives state information about the first battery from the first module management unit and controls the first rack protection circuit based on the state information about the first battery.

6. An energy storage system comprising:
a battery system comprising a first battery rack and a second battery rack;
a converter electrically connected to the battery system;
a DC link electrically connected to the converter; and
a power conversion device which converts electricity between the DC link and at least one of a power generation system, a grid, and a load,
wherein the first battery rack comprises a first rack protection circuit and a first rack management unit, and the second battery rack comprises a second rack protection circuit and a second rack management unit,
wherein the first rack management unit is configured to control both the first and second rack protection circuits, and wherein the second rack management unit is configured to control both the first and second rack protection circuits.

7. The energy storage system of claim 6, further comprising a system management unit, wherein the system management unit controls the converter and the power conversion device and applies a control signal to the first and second rack management units to detect, based on generation of response signals to the control signal, whether the first and second rack management units are in an abnormal state.

8. The energy storage system of claim 7, wherein the system management unit communicates with the first and second rack management units by controller area network (CAN) communication, and the system management unit determines, based on presence of identifiers assigned to the first and second rack management units, whether the first and second rack management units are in an abnormal state.

9. The energy storage system of claim 7, wherein the first battery rack further comprises a first battery module including a first battery and a first module management unit which monitors a state of the first battery, and the second battery rack further comprises a second battery module including a second battery and a second module management unit which monitors a state of the second battery, wherein the first and second rack management units control at least one of the first and second battery modules.

10. The energy storage system of claim 9, wherein, when the system management unit detects that the first rack management unit is in an abnormal state, the second rack management unit receives state information about the first battery from the first module management unit and controls the first rack protection circuit based on the state information about the first battery.

* * * * *